United States Patent
Bosboom et al.

(10) Patent No.: US 9,919,430 B1
(45) Date of Patent: Mar. 20, 2018

(54) APPARATUS, SYSTEM AND METHOD FOR PROVIDING AN END EFFECTOR

(71) Applicants: Jeroen Bosboom, St. Petersburg, FL (US); Babak Naderi, St. Petersburg, FL (US); Richard Munro, St. Petersburg, FL (US); Tatiana Pankova Major, St. Petersburg, FL (US)

(72) Inventors: Jeroen Bosboom, St. Petersburg, FL (US); Babak Naderi, St. Petersburg, FL (US); Richard Munro, St. Petersburg, FL (US); Tatiana Pankova Major, St. Petersburg, FL (US)

(73) Assignee: Jabil Inc., St. Petersburg, FL (US)

( * ) Notice: Subject to any disclaimer, the term of this patent is extended or adjusted under 35 U.S.C. 154(b) by 0 days.

(21) Appl. No.: 15/370,125

(22) Filed: Dec. 6, 2016

(51) Int. Cl.
*H01L 21/687* (2006.01)
*B25J 15/00* (2006.01)
*B25J 11/00* (2006.01)

(52) U.S. Cl.
CPC ....... *B25J 15/0014* (2013.01); *B25J 11/0095* (2013.01); *H01L 21/68707* (2013.01); *Y10S 414/141* (2013.01)

(58) Field of Classification Search
CPC .. B25J 15/0014; B25J 11/0095; B25J 19/025; H01L 21/683; H01L 21/68707; Y10S 414/141
USPC ............................................... 294/213, 103.1
See application file for complete search history.

(56) References Cited

U.S. PATENT DOCUMENTS

| | | | | |
|---|---|---|---|---|
| 6,256,555 B1 * | 7/2001 | Bacchi | ............. | H01L 21/68707 294/185 |
| 6,454,332 B1 * | 9/2002 | Govzman | ............. | H01L 21/681 294/103.1 |
| 6,491,330 B1 * | 12/2002 | Mankame | ......... | H01L 21/68707 294/103.1 |
| 7,300,082 B2 * | 11/2007 | Rogers | ................... | B25J 13/085 294/104 |
| 7,611,182 B2 * | 11/2009 | Kim | .................. | H01L 21/68707 294/103.1 |
| 7,654,596 B2 * | 2/2010 | Mantz | ............... | H01L 21/68707 294/103.1 |
| 8,720,965 B2 * | 5/2014 | Hino | ................. | H01L 21/67742 294/103.1 |
| 8,764,085 B2 * | 7/2014 | Urabe | ............... | H01L 21/68707 294/103.1 |
| 2006/0157998 A1 * | 7/2006 | Gershenzon | ...... | H01L 21/68707 294/103.1 |

* cited by examiner

*Primary Examiner* — Dean J Kramer
(74) *Attorney, Agent, or Firm* — Thomas J. McWilliams; Barnes & Thornburg LLP

(57) ABSTRACT

The disclosure provides an apparatus, system and method for providing an end effector. The end effector may be capable of accommodating semiconductor wafers of varying sizes, and may include: a wafer support; a bearing arm capable of interfacing with at least one robotic element, and at least partially bearing the wafer support at one end thereof; a plurality of support pads on the wafer support for physically interfacing with a one of the semiconductor wafers; and a low friction moving clamp driven bi-directionally along a plane at least partially provided by the bearing arm, wherein the low friction moving clamp retractably applies force to a proximal edge of the semiconductor wafer.

18 Claims, 16 Drawing Sheets

APPARATUS, SYSTEM AND METHOD FOR PROVIDING AN END EFFECTOR

BACKGROUND

Field of the Disclosure

The present disclosure relates to the transfer of articles, such as semiconductor wafers, and more particularly to an end effector for gripping such wafers and a method for handling and transferring such wafers using the end effector.

Description of the Background

The use of robotics is well established as a manufacturing expedient, particularly in applications where human handling is inefficient and/or undesirable. One such circumstance is in the semiconductor arts, in which robotics are used to handle wafers during various process steps. Such process steps may include, by way of example, chemical mechanical planarization (CMP), etching, deposition, passivation, and various other processes in which a sealed and/or "clean" environment must be maintained, such as to limit the likelihood of contamination and to ensure that various specific processing conditions are met.

Current practice in the semiconductor arts to robotically handle these wafers often includes the use of an end effector operably attached to the robotics, such as in order to load semiconductor wafers from a loading stack into the various processing ports that may correspond to the aforementioned exemplary process steps. The robotics are employed to deploy the end effector to retrieve the wafer from a particular port or stack, such as before and/or after processing in an associated process chamber. The wafer may thus be shuttled by the robotics connectively associated with the end effector to subsequent ports for additional processing. When the wafer processing stages are complete, the robotics may then return the processed semiconductor wafer to a loading port, and may, again using the end effector, then retrieve the next wafer for processing by the system. It is typical that a stack of several semiconductor wafers is processed in this manner using the end effector during each process run.

Typical end effectors hold the wafer on its bottom side, such as using backside suction provided by, for example, vacuum draw eyelets on the end effector. The application of other mechanical forces directly to the wafer is atypical, in part because the application of mechanical forces is generally understood to have a high likelihood of damaging or contaminating the wafer.

Accordingly, there is a need for an end effector that may readily handle and transfer very thin semiconductor wafers, preferably of multiple wafer sizes and for multiple process steps, without damaging or contaminating such wafers.

SUMMARY

Certain embodiments are and include an apparatus, system and method for providing an end effector. The end effector may be capable of accommodating semiconductor wafers of varying sizes, and may include: a wafer support; a bearing arm capable of interfacing with at least one robotic element, and at least partially bearing the wafer support at one end thereof; a plurality of support pads on the wafer support for physically interfacing with a one of the semiconductor wafers; and a low friction moving clamp driven bi-directionally along a plane at least partially provided by the bearing arm, wherein the low friction moving clamp retractably applies force to a proximal edge of the semiconductor wafer to provide the physical interfacing of the semiconductor wafer with the plurality of support pads.

The wafer support may be or include a fork portion. The wafer support may also include presence sensing for wafers. The varying sizes of wafers held by the wafer support may include, by way of non-limiting example, 200 mm and 300 mm wafers.

The bi-directional drive may include at least a moving clamp motor. A low friction vacuum cylinder may be engaged for the moving clamp motor. The vacuum cylinder may consist of a seal-less glass tube with a graphite piston.

The end effector may also include at least one retract stop that stops retraction of the low friction moving clamp after actuation of the low friction moving clamp by the bi-directional drive. The at least one retract stop may be vacuum operated. The at least one retract stop may be, for example, a popping "button" stop.

The low friction moving clamp may include an angular strike face to apply the strike force to the wafer. The angular strike face may pivot about a substantially center pivot point in order to optimally engage the wafer. The low friction moving clamp further may include two canted rollers at the outermost portions thereof which are capable of substantially imparting the strike force to the wafer edge.

The plurality of support pads may include at least four support pads, wherein at least two of the four support pads are proximal to the bearing arm, and wherein at least two others of the support pads are distal to the bearing arm. The at least two distal support pads each may each include a ramped portion and a roller portion having a center axis canted in relation to a center axis of the semiconductor wafer. The at least two proximal support pads may also include a ramped portion. The proximal support pads and/or the distal support pads may additionally include a raised ridge portion.

Thus, the disclosure provides at least an apparatus, system and method for providing an end effector that may readily handle and transfer very thin semiconductor wafers of multiple wafer sizes and for multiple process steps, without damaging or contaminating such wafers

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

Figure 1:
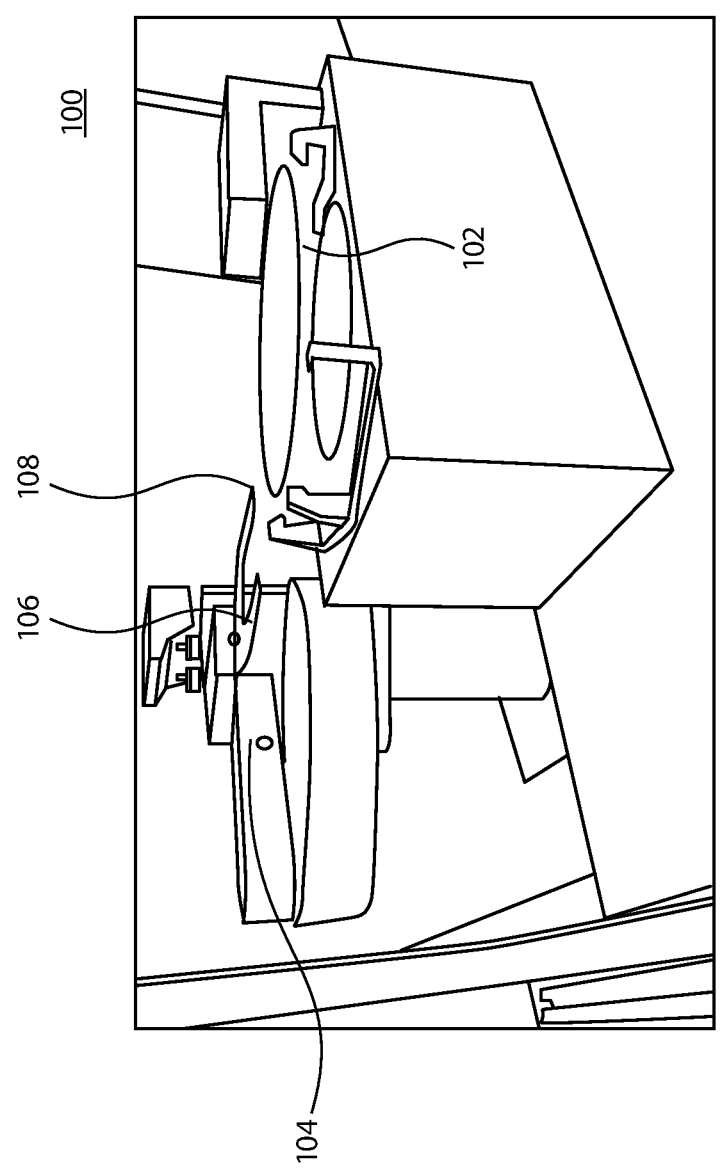
FIG. 1 is an illustration of a wafer handling system according to the disclosed embodiments.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

FIG. 1 illustrates an automated wafer handling system 100 suitable to precisely handle semiconductor wafers or substrates 102, such as silicon wafers, of varying diameters, compositions and physical attributes. The handling system 100 may be capable of supplying wafers 102 in a rapid, ordered succession for wafer processing. The wafers 102 supplied may be manipulated or transferred among various locations for processing, in part, by robotics, such as a robotic arm 104, equipped with an edge grip end effector 106 adapted to perform the aforementioned manipulation and transfer.

The robotic arm 104 and end effector 106 cooperate to place and remove wafers 102 to and from wafer processes, one or more wafer aligners, and one or more wafer cassettes, by way of non-limiting example. To that end, the end effector 106 may include one or more vacuum eyelets 108 to securely hold a subject wafer 102 in the vertical, horizontal, and inverted orientations required during wafer processing, in addition to providing or supplementing the various wafer gripping aspects discussed herein throughout.

As such, the example of FIG. 1 illustrates a system 100 in which the exemplary end effectors 106 disclosed herein below may be operable. In short, the illustrated edge grip end effector 106, which is representative of the various types of end effectors 106 discussed below, may retrieve wafers 102 from one or more cassettes, such as for clocking of the retrieved wafers with a process aligner, and/or subsequently with various wafer processes. More particularly, the various end effector types provided in certain of the embodiments may provide for use of a single end effector 106 with multiple different wafer diameters through the various referenced wafer processes.

Not only do semiconductor wafers vary in diameter, they are also typically manufactured according to standardized specifications which, among other dimensional tolerances including the diameter, require the surface for receiving device builds thereon to be substantially planar, such as with a flatness of 1.5 microns or less. Further and by way of example, 200 mm silicon wafers, for example, have a standard diameter of 200+/−0.2 mm and a standard thickness such as 675+/−25 microns. A typical wafer thickness after processing may range from about 500 microns to about 700 microns. Additionally, silicon wafers may be provided with a specific flat or a notch used for alignment and/or indicative of crystalline orientation. Hence, maintenance of wafer flatness during interaction of the wafer with the end effector 106 is key to obtaining acceptable levels of wafer throughput and waste.

Thinner wafers may be particularly useful for certain integrated circuit applications, especially in those applications that necessitate more minimal thicknesses after processing. However, wafer processing may introduce warpage or bowing that exceeds the allowable flatness, and some wafers may have warpage or bowing beyond the desirable levels even in an unprocessed state. Moreover, warpage or bending may cause improper placement or alignment of the aforementioned alignment flat or notch. In such cases, wafer processing may be adversely affected by the warpage or bending, and these adverse effects may be exacerbated by any warpage or bending imparted by end effector 106.

The foregoing issues resultant from warpage and bowing may be exacerbated for thinner wafers. Accounting for flatness beyond variance is thus a significant issue in modern wafer processing, and the ability to account for flatness variance is yet more significant and complex in wafer handlers that allow for different wafer sizes for wafer processing. Thus, the providing of an end effector 106 that minimizes the impact of interaction by the end effector on wafer flatness, and that perhaps even provides remediation of wafer warpage, is highly advantageous in the disclosed embodiments.

Figure 2:
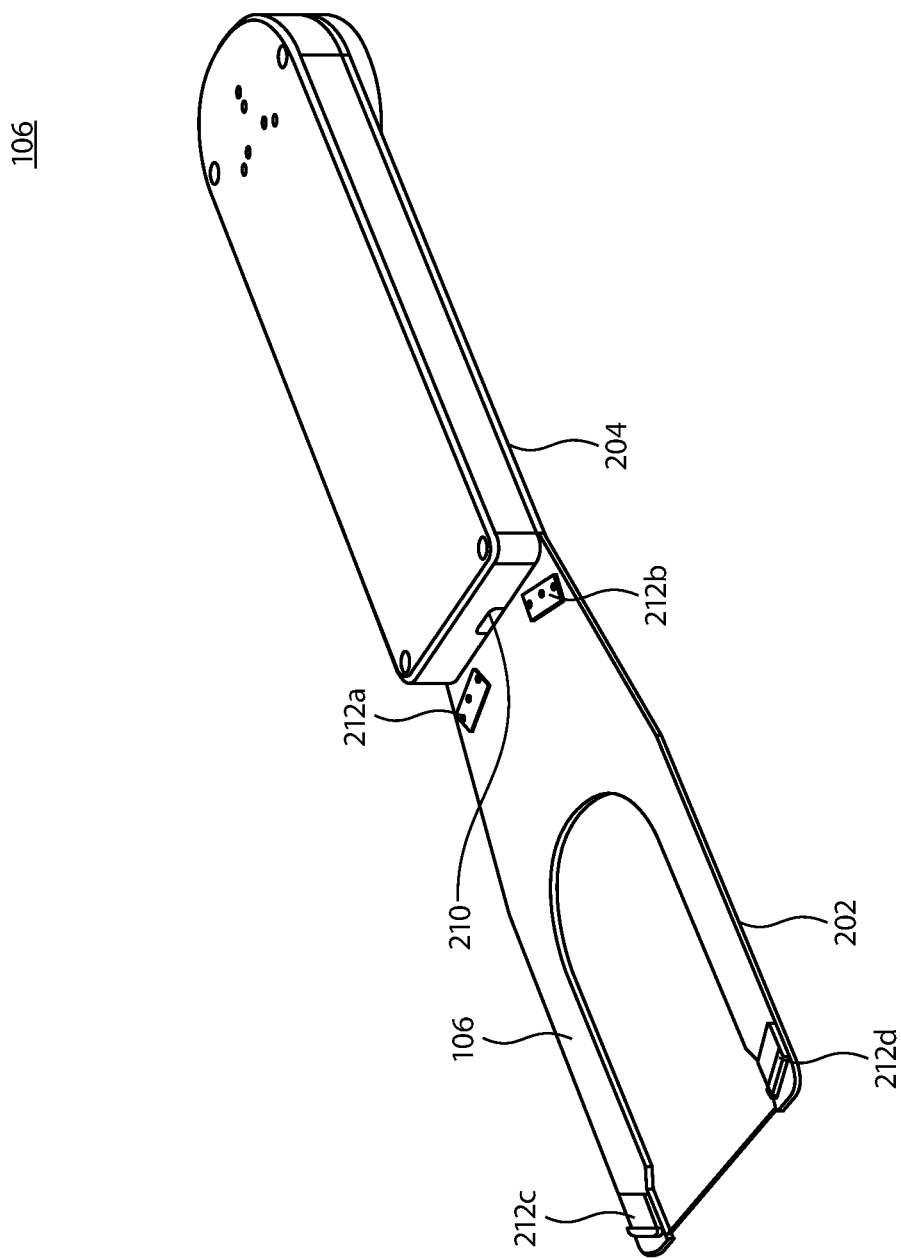
FIG. 2 is an illustration of an end effector according to the disclosed embodiments.

FIG. 2 illustrates an exemplary edge grip end effector 106 according to certain of the embodiments. In the illustration of FIG. 2, the end effector 106 includes a fork portion 202 on which a silicon wafer 102 may rest upon retrieval, and a bearing arm 204 that may interface to one or more robotics, such as the robotic arm illustrated in FIG. 1. The fork portion 202 may be comprised of, by way of non-limiting example, 17.4 pH stainless steel, heat-treated to H900 condition. Of note, the fork portion 202 discussed throughout is merely exemplary of a wafer support that may be at least partially supported by bearing arm 204. That is, other types of wafer supports may be used in certain of the embodiments, such as a spatula type or a ring type, by way of example.

The bearing arm 204 may include, for example, electronic circuitry for actuating one or more electromechanical elements within or on the bearing arm 204, such as for causing the physical association of the fork portion 202 with a wafer 102. The bearing arm 204 may additionally include sensors, processing capabilities, computer memory, networking capabilities, such as wireless connectivity, unique identifications (such as RF identification), process counters, electromechanical interactions with the robotic arm 104, batteries, such as high-density rechargeable batteries, and the like.

An electromechanical element associated with the bearing arm 204 for causing a physical interaction between the fork portion 202 and the wafer 102 may be moving clamp 210. The moving clamp may include, such as on the portion thereof that abuts wafer 102, one or more pads for minimizing interaction forces between the moving clamp 210 and the wafer 102. The moving clamp 210 may be electromechanically actuated, such as by directly or indirectly, and such as by one or more vacuum, pneumatic or motorized actuators, or may be mechanically actuated, such as via spring actuation, to extend outwardly from the bearing arm 204 toward the fork portion 202 in order to grip, move, or otherwise align a silicon wafer 102 for physical association with the fork portion 202.

Further illustrated in FIG. 2 is a plurality of, such as four, pads 212a-d on which the silicon wafer 102 physically associated with the fork portion 202 and subjected to the moving clamp 210 may rest. In the illustration, the support pads 212a-d may be ramped, such as wherein the pads 212a-d are sloped downward toward the center of the silicon wafer 102, or may be ridged, such as to provide support for or stoppage of movement of the wafer 102 when the wafer 102 is physically associated with the pad 212a-d. The support pads 212a-d may be smooth, semi-frictional, or highly frictional along the surfaces thereof, and may vary among the foregoing on different surfaces thereof. In the illustrated embodiment, the support pads 212a-b proximate to the moving clamp 210 physically differ from the pads 212c-d at the distal end of the fork portion 202, at least in that the distal support pads 212c-d act as clamp pads. That is, for certain pads 212c-d, a raised/ridged portion associated with the pad edges most distant from the moving clamp 210 may serve to provide pressure against the most distal portion of the circumference of the wafer 102 associated with the fork portion 202. As referenced, this may differ from the simple ramped support pads 212a-b at the base of the fork portion 202 most proximate to the moving clamp 210.

Figure 3:
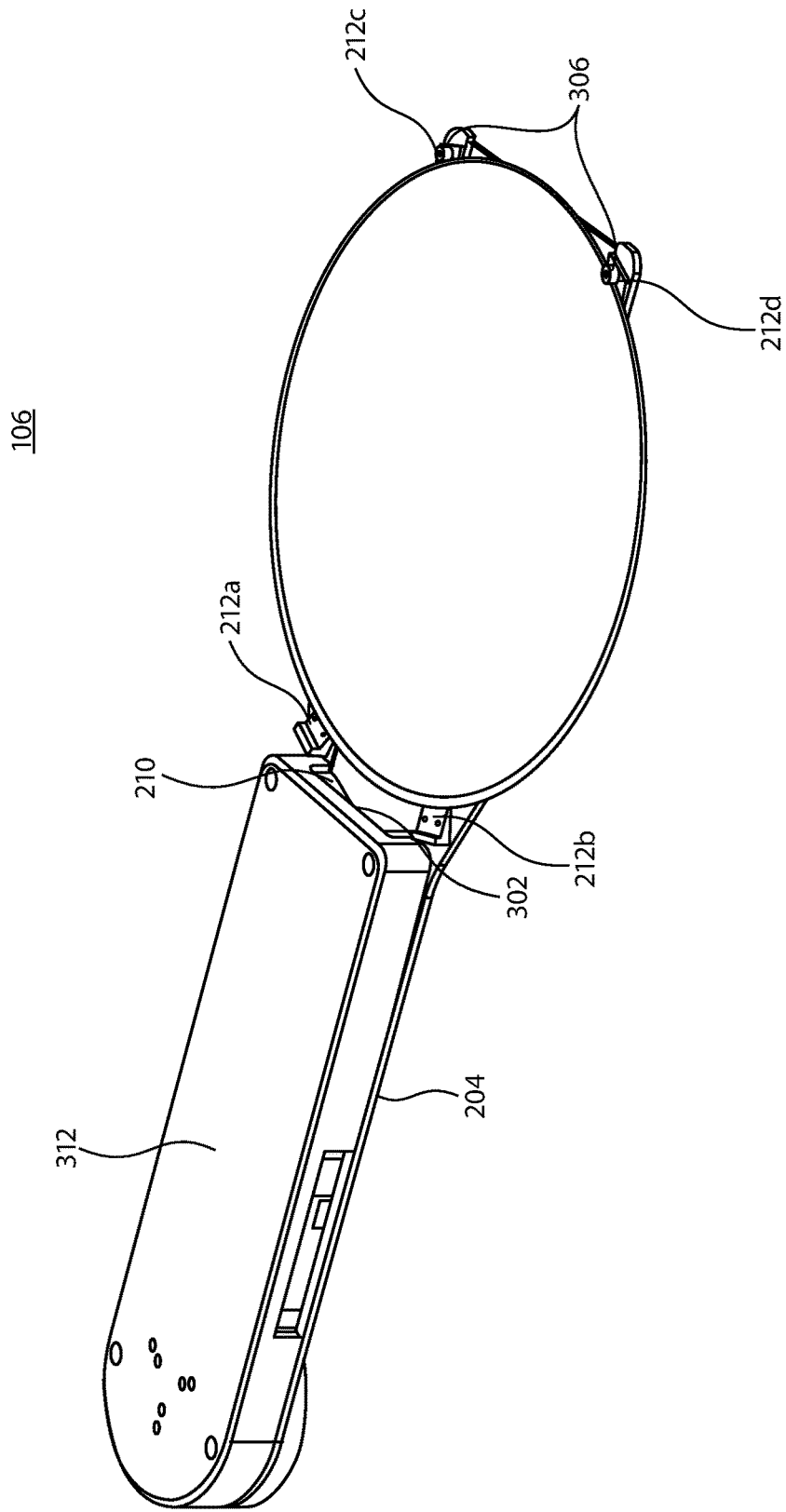
FIG. 3 is an illustration of an end effector according to the disclosed embodiments.

FIG. 3 illustrates an embodiment of an edge grip end effector 106. In the illustration, an alternative type of moving clamp 210 may be provided, and consequently the clamp emergence slot 302 at the base of the fork portion 202 is enlarged to allow for emergence and retraction of the alternatively shaped moving clamp 210. Moreover, in the exemplary illustration of FIG. 3, the proximate support pads 212a-b now include a ridge at the distal portion thereof with respect to the center of the wafer, such as to provide a stop for movement of the wafer 102. Yet further, the support pads 212c-d at the most distal aspect of the fork portion 202 from the moving clamp 210 may include the illustrated roller tips 306 to better provide for physical interaction with and stoppage of movement of a wafer 102 associated with the fork portion 202 with minimal risk of damage to the wafer.

Roller tips 306 may or may not be canted so as to better grip an associated wafer 102. Canted roller tips 306 may particularly improve the handling of worked or thick wafers, and may accordingly be provided proximal to and/or distal from the moving clamp 210. Roller tips 306 may be, for example, formed of stainless steel, and may improve the centering of particularly thin wafers physically associated with the fork portion 202.

Figure 4:
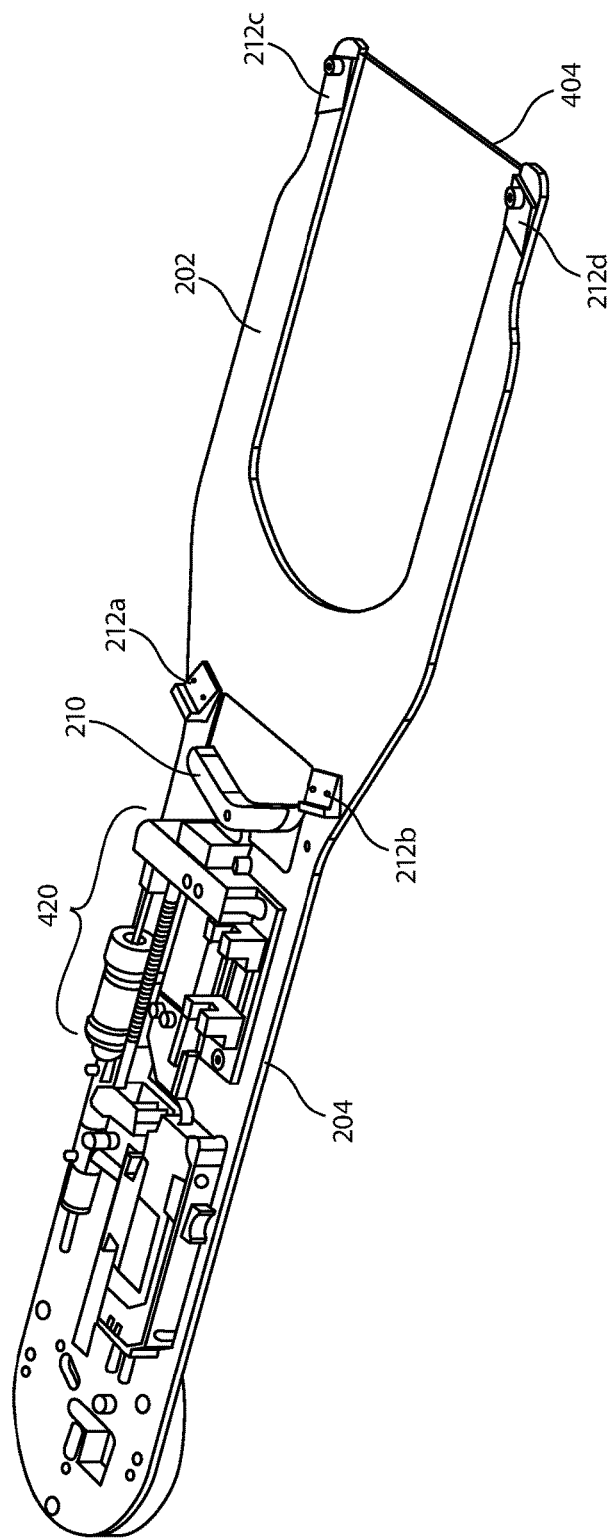
FIG. 4 is an illustration of an end effector according to the disclosed embodiments.

FIG. 4 illustrates an embodiment of an end effector 106. The example of FIG. 4 is similar to that of FIG. 3, but does not include the bearing arm cover 312 on bearing arm 204 of FIG. 3. In the illustration of FIG. 4, the roller tip support pads 212c-d and ridged proximal support pads 212a-b are again included on the fork portion 202. Additionally illustrated in FIG. 4 is a wafer detection system 404, which is shown at the most distal portion of the fork portion 202 by way of non-limiting example. Such a wafer detection system 404 may be or include, by way of non-limiting example, a fiber-optic beam that detects the presence and/or characteristics of a wafer 102 physically associated with the fork portion 202.

Also illustrated in FIG. 4 is a moving clamp in the form of an angular moving clamp 210 that, upon actuation, emerges from the emerging slot 302 within the bearing arm housing 312. This angular clamp 210 is electromechanically actuated, as shown, such as by an actuator 420, and may be subject to drive length limitations that limit the available linear travel distance of the angularly moving clamp 210.

Figure 5:
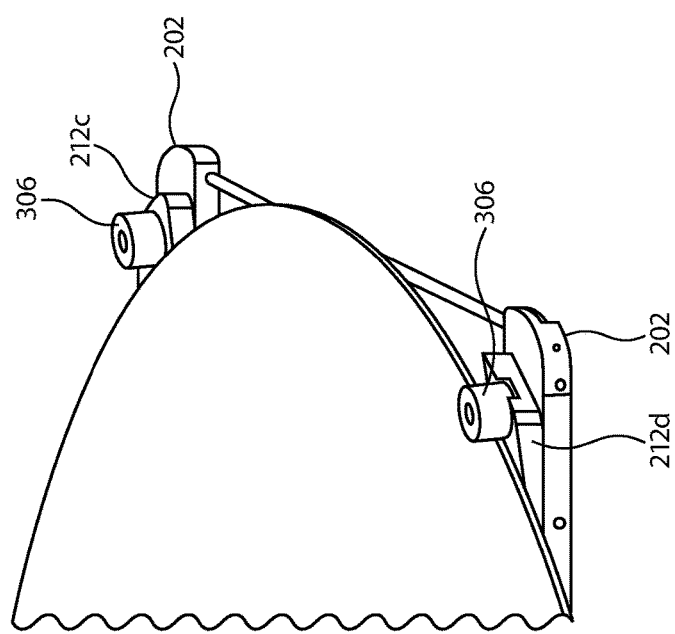
FIG. 5 is an illustration of wafer support pads according to the disclosed embodiments.

FIG. 5 is an additional illustration of exemplary roller pads 212c-d at the distal end of the fork portion 202. In the illustration, it is evident that not only are these exemplary distal support pads 212c-d provided with roller portions 306, but further that these exemplary support pads 212c-d are ramped with a downward slope towards the center of a silicon wafer 102 associated with the fork portion 202.

It will be appreciated that angled or curved support pads may include a dual surface area for receiving the wafer, such that the wafer cannot hit a corner and thereby not have sufficient surface area to be gripped. This angle or curvature may be smaller on the inside angle and larger on the outside angle, by way of non-limiting example. Moreover, the ramp design discussed throughout for the support pads may also improve grip while precluding lower wafer features from bottoming on the fork portion 202.

Figure 6:
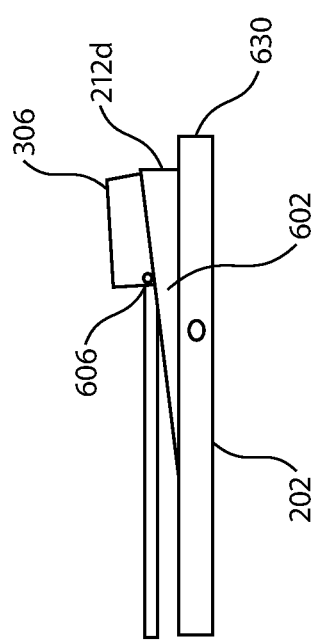
FIG. 6 is an illustration of wafer support pads according to the disclosed embodiments.

Distal support pads 212c-d with a roller portion 306 may be viewed with particularity in the illustration of FIG. 6. FIG. 6 provides a cross-sectional view of a distal support pad 212c having ramp and roller portions 602, 306, wherein the distal circumference 606 of the silicon wafer 102 abuts the roller portion 306 of the distal support pad 212c, such as when engaged at the proximal circumference by the moving clamp 210. The engaging angular moving clamp 210 may be, by way of non-limiting example only, the moving clamp 210 illustrated in FIG. 4.

Of particular note with respect to the illustrations of FIGS. 4, 5, and 6, it is optimal that the end effector fork portion 202 avoids contact, to the extent possible, with the bottom of a wafer 102 physically associated therewith. This functionality may be provided by the ramp nature of the support pads 212a-d, such as in conjunction with distal support pads 212c-d having rollers 306 thereon, and may additionally include bends in or ramping features on the fork portion 202. By way of additional example, the prongs 630 of the fork portion 202 may bend with a slight slope downward towards a center point between the prongs 630. That is, proximate to the bearing arm the fork portion 202 may be included one or more bends, ramps, or upward or downward slopes, and, in such embodiments, the prongs 630 of the fork portion may or may not include a corresponded slope, bend or ramp towards the distal support pads 212c-d.

Figure 7:
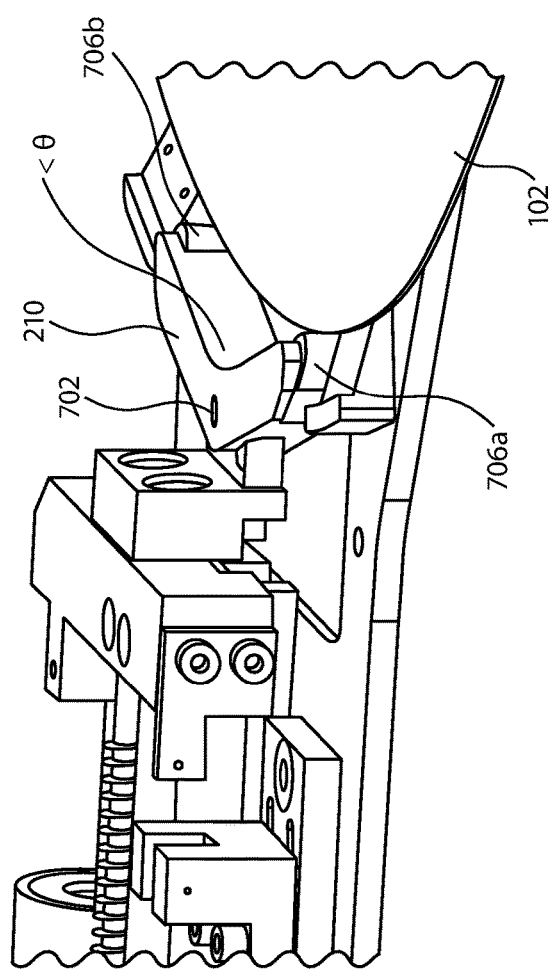
FIG. 7 is an illustration of an end effector according to the disclosed embodiments.

FIG. 7 illustrates an exemplary angular moving clamp 210. In the embodiment of FIG. 7, the angular clamp 210 includes a first pivot point 702 about which the angle Θ of the clamp may pivot in order to improve centering of the wafer 102 associated with the strike face of the moving clamp 210. Moreover, and by way of non-limiting example only, the angular moving clamp 210 of FIG. 7 additionally includes canted rollers 706a-b at the outermost portions of the angular moving clamp 210. These rollers 706a-b may or may not be canted in certain embodiments, and may serve to gently press upon an edge of the wafer 102, such as by pressing the wafer 102 against a ramped, ridged, and/or roller portion of the support pads 212a-d.

Figure 8:
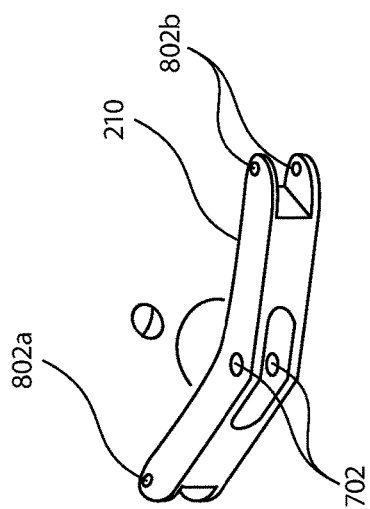
FIG. 8 is an illustration of a moving clamp according to the disclosed embodiments.

FIG. 8 illustrates an exemplary angular moving clamp 210. In the embodiment of FIG. 8, and by way of non-limiting example, pivot point 702 for the moving clamp 210 may be provided substantially at the center point of the clamp angle Θ. Further provided are secondary pivot points 802a-b for receiving one or more rollers 706a-b at substantially the outermost portions from pivot point 702 of the angular moving clamp 210. Such rollers 706a-b may or may not be received at pivots 802a-b in canted manner similar to the exemplary canted roller illustrated in FIG. 7.

Figure 9:
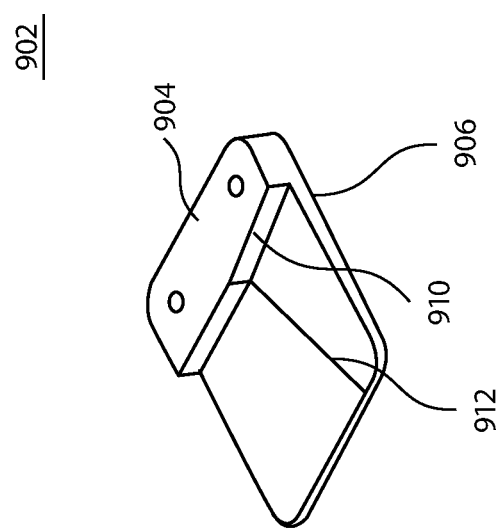
FIG. 9 is an illustration of a wafer support pad according to the disclosed embodiments.

FIG. 9 provides an exemplary illustration of a support pad 902, such as may be used as a proximal or distal support pad or pads 212a-d. In the example of FIG. 9, the support pad 902 is provided with a ridge 904 at the topmost portion of a ramp 906, and the ridge 904 provided may have two distinct planar portions, such as an angular or curved portion 910, on the upper surface thereof. Moreover, and by way of non-limiting example, the ramped portion 906 of the support pad 902 of FIG. 9 may additionally include one or more ridges or distinct planes 912. The upper ridge, such as may include an angular or curved portion, may provide improved positioning of a wafer 102 associated with the fork portion 202 in certain embodiments. A ridged ramp 902 may improve contact with and centering of a wafer 102 associated with the fork portion 202.

Figure 10:
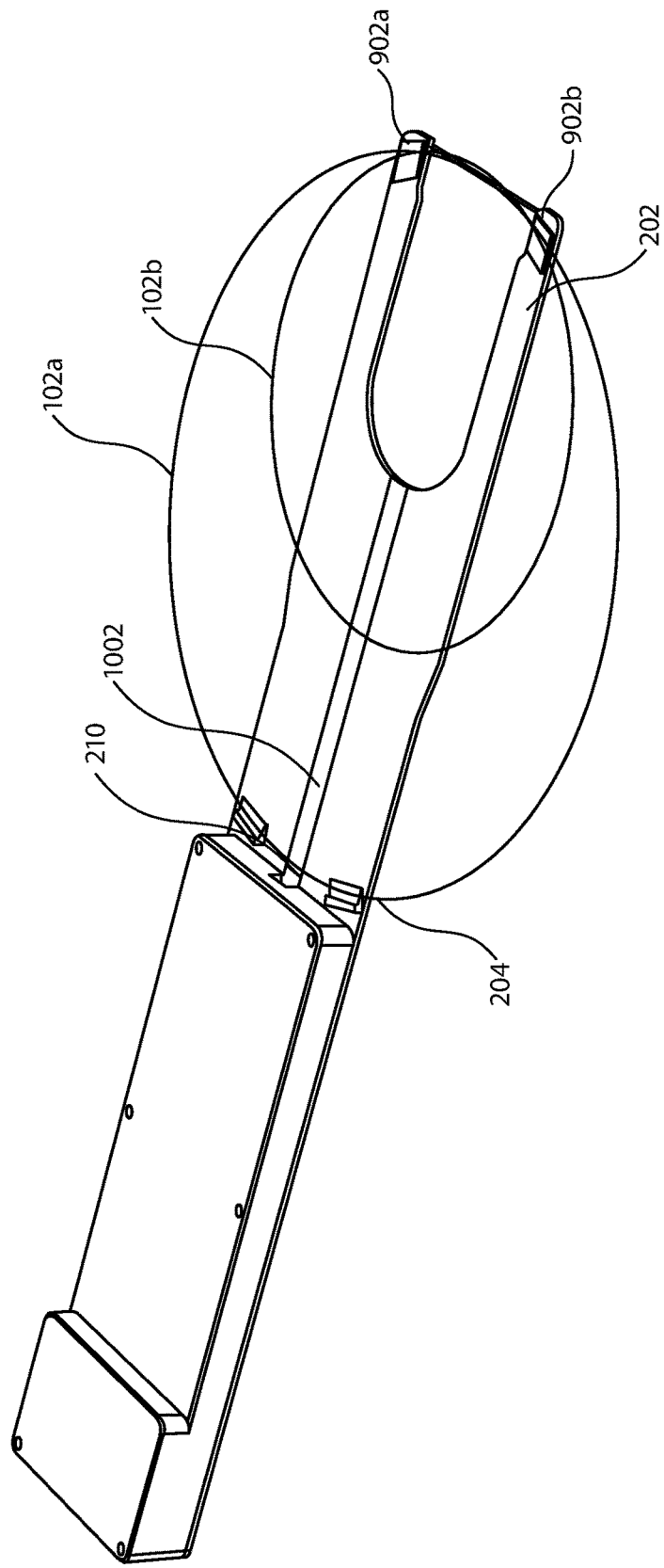
FIG. 10 is an illustration of an end effector according to the disclosed embodiments.

FIG. 10 illustrates an embodiment in which a rectangular moving clamp 210, such as the exemplary embodiment illustrated with respect to FIG. 2, moves along a slot 1002 along the bearing arm 204 toward the fork portion 202 as shown, may allow for two or more different types of wafers 102a, 102b to be physically associated with the fork portion 202. More specifically and by way of non-limiting example, in the embodiment of FIG. 10 the moving clamp 210 is shown as being positionally available to accommodate a 200 mm or a 300 mm wafer in physical association with the fork portion 202. Moreover, illustrated at the most distal portion of the fork portion 202 in FIG. 10 are distal support pads 902a-b such as those shown in FIG. 9, which are used to improve wafer contact for wafers having radii of differing geometries. Of course, other types of support pads 212a-d referenced throughout may be used in the embodiment of FIG. 10, and/or with other embodiments discussed herein throughout.

Figure 11:
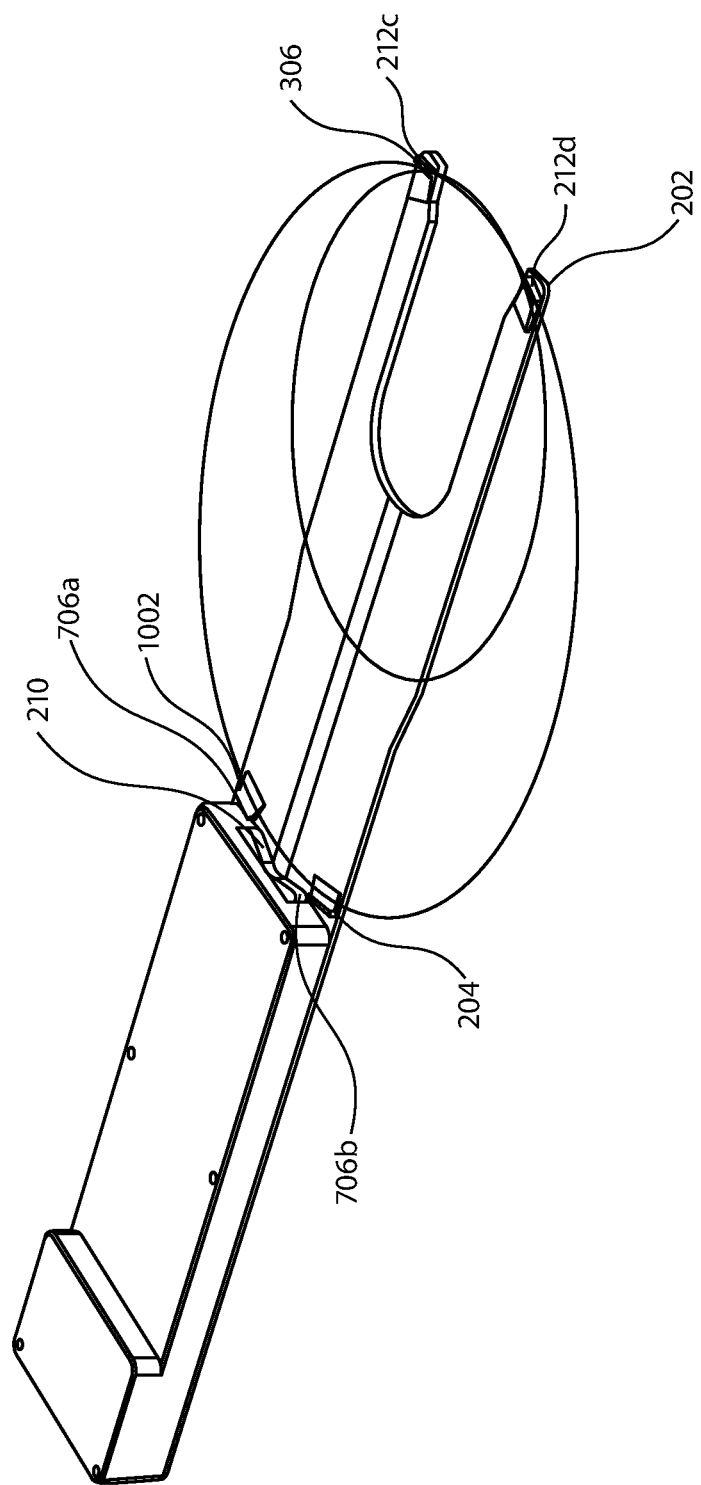
FIG. 11 is an illustration of an end effector according to the disclosed embodiments.

FIG. 11 illustrates an embodiment similar to that of FIG. 10 in which, rather than a rectangular moving clamp 210, an angular moving clamp 210 is employed. The angular clamp 210 of FIG. 11 is provided with roller tips 706a-b at the most distal angular portions of the angular clamp 210. Moreover, in this particular illustration, the distal support pads 212c-d also include roller tips 306.

Figure 12:
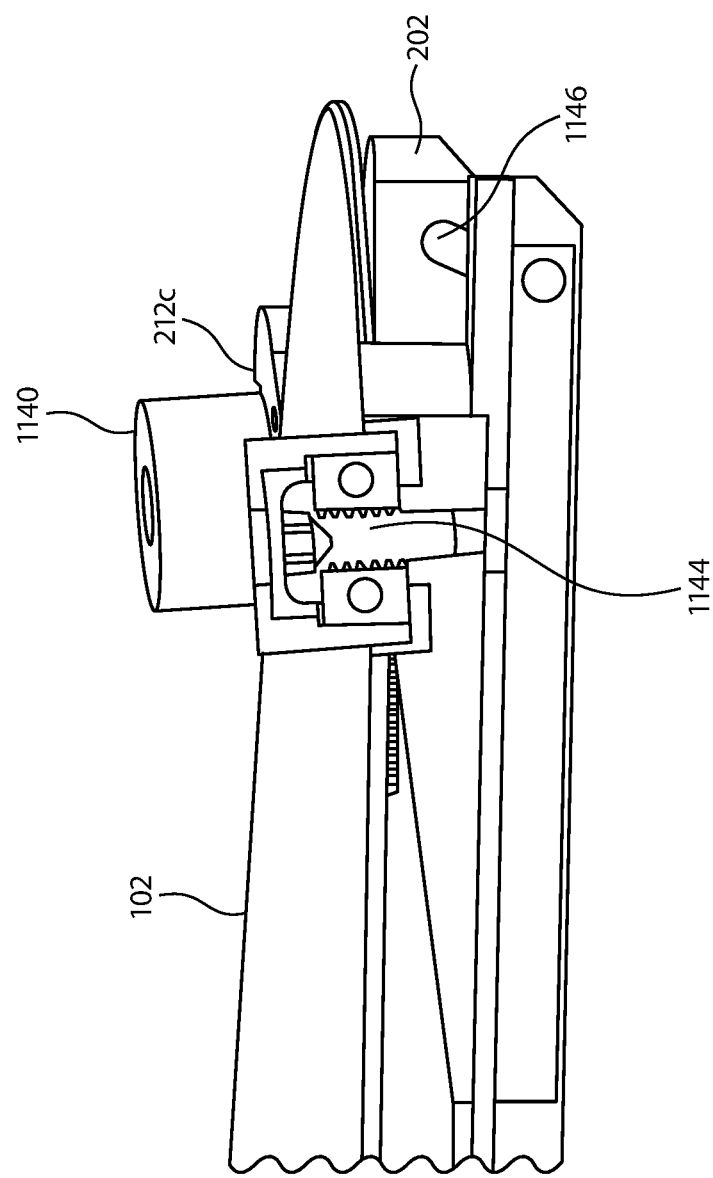
FIG. 12 is an illustration of a wafer support pad according to the disclosed embodiments.

FIG. 12 illustrates an embodiment of a roller tip distal support pad 212c. The illustrated distal roller support pad 212c may be provided for use in certain of the embodiments discussed throughout, such as in the embodiment illustrated in FIG. 11 by way of non-limiting example. In the illustration of FIG. 12, the rollers 1140 are canted, with a tilt inwards towards the center of a wafer 102 associated with the fork portion 202. Such roller tips 1140 may, for example, particularly prevent edge friction on thin, knife-edged wafers, such as wafers having an edge thickness of 50-150 um. Also cross-sectionally illustrated in FIG. 12 is an adjustment 1144 for the roller cant, as well as a mapping feature 1146 that may be associated with the roller tip 1140 for mapping a wafer 102 associated with the fork portion 202.

Figure 13:
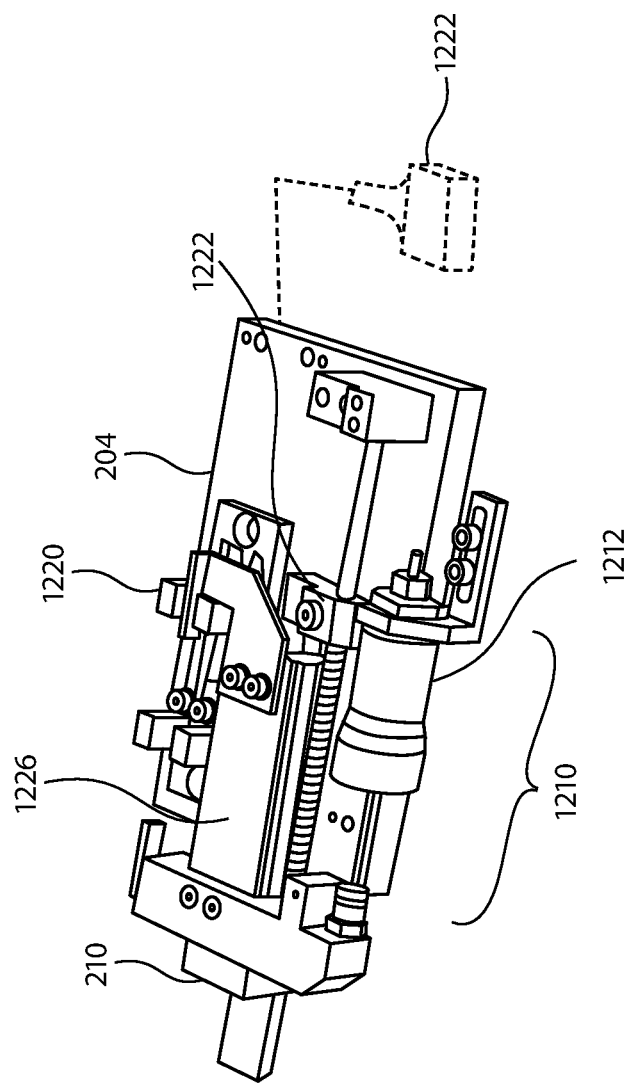
FIG. 13 is an illustration of a moving clamp motor according to the disclosed embodiments.

FIG. 13 illustrates an exemplary clamp motor 1210, which resides on the bearing arm 204 and which actuates a moving clamp 210 to move the clamp outwardly toward the distal end of the fork portion 202 for engaging with a wafer 102, as discussed herein throughout. In the illustration of FIG. 13, a rectangular moving clamp 210 is illustrated, although it will be appreciated in light of the discussion herein that an angular moving clamp 210 might instead be provided with the embodiment of FIG. 13.

Illustrated by way of non-limiting example is a low-friction actuator 1212, such as a vacuum cylinder, for engaging the moving clamp 210. This low-friction vacuum cylinder 1212 may enable low clamping forces so as to prevent or minimize damage to the wafer 102. In general, the moving clamp of certain of the embodiments may be actuated using low friction mechanisms. By way of example, low friction actuation may be a long stroke actuation, such as a 121 mm stroke by way of non-limiting example, but may be configurable to any length.

Yet more particularly and by way of non-limiting example, the moving clamp actuator 1212 may be a vacuum cylinder with a glass tube and graphite piston in a seal-less design (i.e., an air pot). Such an actuator 1212 may allow for very low clamping loads, such as clamping loads of 2 oz. or less. Of course, a low-friction roller slide (such as slide 1226 of FIG. 14) in conjunction with a low friction moving clamp actuator 1212 may further limit prospective damage to the wafer. Nevertheless, it will be appreciated that other actuation methodologies 1212, such as electric motors, may also be employed in the embodiments.

The clamp force and clamp speed of moving clamp 210 may be subject to adjustment and control 1222, as is also illustrated in FIG. 13. This adjustment and control 1222 may further minimize damage to a wafer 102 associated with the fork portion 202. As such, high-precision control 1222 may be provided for the moving clamp stroke, such as a precision flow control that meters air to vacuum cylinder 1212 in order to control the clamping speed.

Position sensing 1220 may also occur with regard to movement of the moving clamp 210 in certain of the embodiments. The position of the moving clamp 210 may be directly or indirectly assessed by position sensing 1220, such as wherein the position of low-friction roller slide 1226 used to slide the moving clamp 210 towards the fork portion 202 is assessed, rather than the actual position of the clamp 210. Of note, any movement of the moving clamp 210, such as along low friction slide 1226 or along any other track, may be low-friction in nature, at least because minimizing friction may also minimize prospective damage to a wafer 102 that is associated with the fork portion 202.

Figure 14:
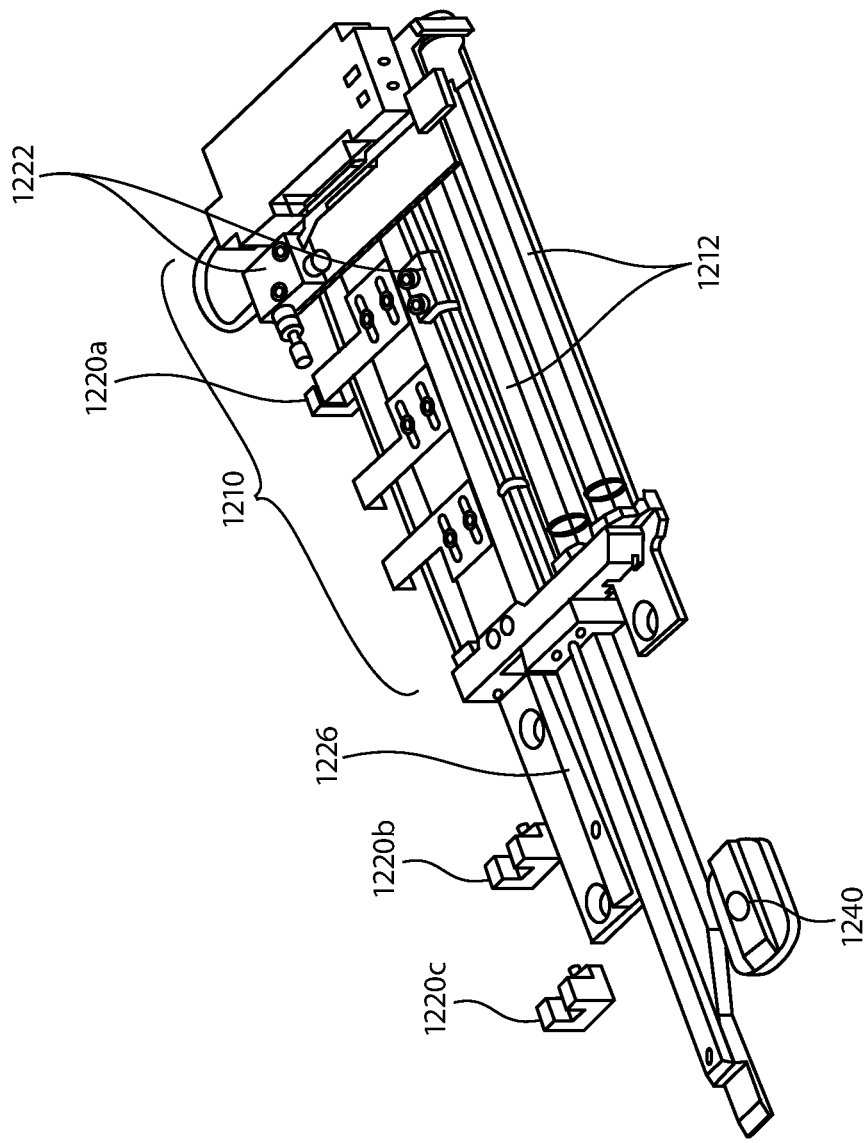
FIG. 14 is an illustration of a moving clamp motor according to the disclosed embodiments.

FIG. 14 illustrates an additional embodiment of a dual position clamp motor 1210 for use with certain of the embodiments discussed herein. Similarly to FIG. 13, the certain embodiment of FIG. 14 includes a low friction roller slide 1226, one or more low-friction vacuum cylinders 1212 for actuating the moving clamp 210, and clamp speed controller 1222 to minimize the likelihood of wafer damage.

FIG. 14 also illustrates multiple position sensors 1220a, b, c for sensing the position of the moving clamp 210. By way of non-limiting example, first position sensor 1220a may indicate that the moving clamp 210 is fully retracted. Second position moving sensor 1220b may indicate that the moving clamp 210 is engaging with a first, larger wafer size, such as a 300 mm wafer 102a. Third position sensor 1220c may indicate that the moving clamp 210 has reached its maximum allowable travel distance, and is thereby engaging the smallest allowable wafer size for association with the fork portion, such as a 200 mm wafer 102b.

FIG. 14 also illustrates a retractable stop 1240 to limit the retraction capability of the moving clamp 210 for smaller wafer sizes, such as for a 200 mm wafer 102b. The retract stop 1240 may also serve as a travel stop, rather than a retraction stop, as will be understood in light of the discussion herein. The retract stop 1240 may, by way of non-limiting example, be vacuum-operated and/or spring extended. Moreover, a plurality of retract or travel stops may be included to support a variety of wafer types having different moving clamp stroke distances, each associated with a respective one of the travel or retract stops.

Figure 15:
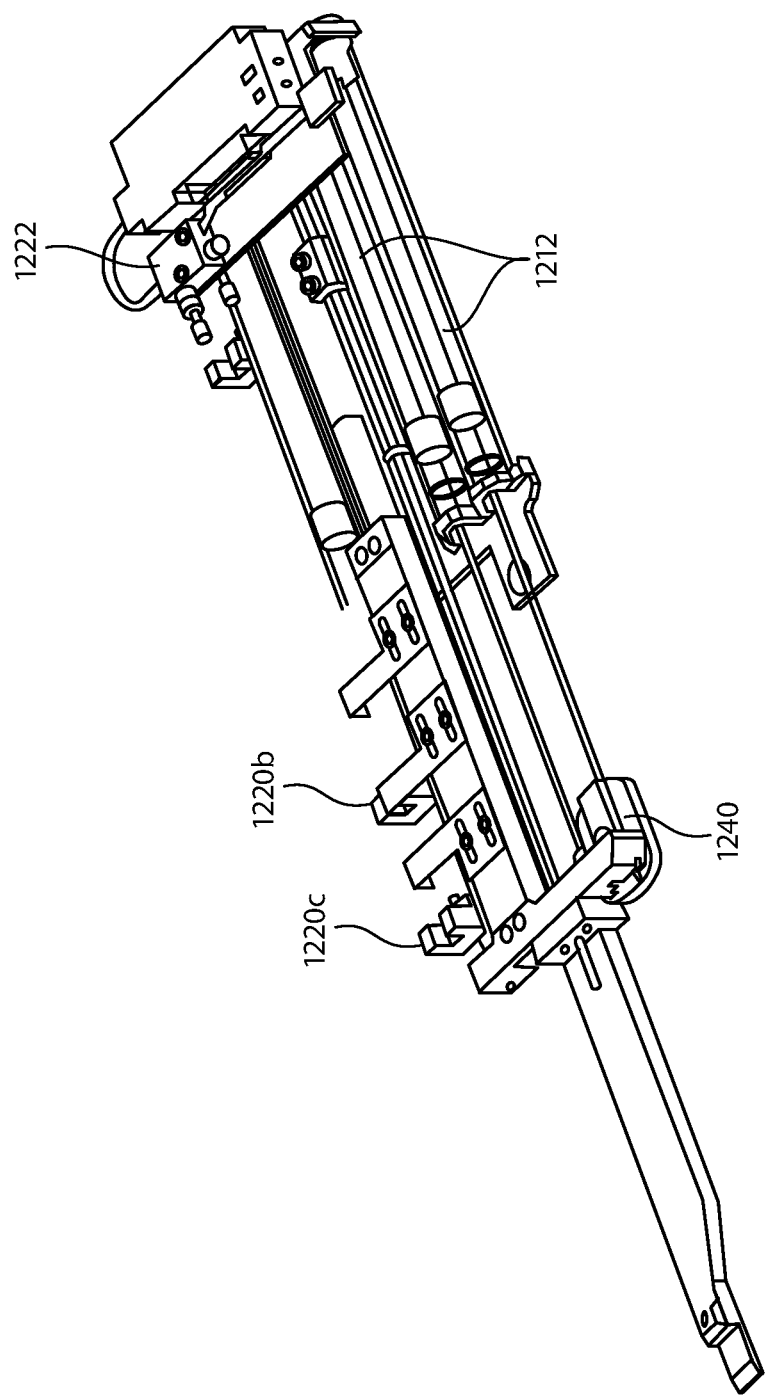
FIG. 15 is an illustration of a moving clamp motor according to the disclosed embodiments.

FIG. 15 is an illustration similar to that of FIG. 14, but with the retract stop 1240 extended. As illustrated, extension of the retract stop 1240 may shorten the clamp cycle distance, such as to limit the ability of the clamp to retract back towards the bearing arm housing 212 when smaller wafer sizes, such as a 200 mm wafer, are physically associated with the fork portion 202. This may save cycle time for smaller wafer sizes. Of additional note, one or more retract stops 1240 may be included to save cycle times for different size wafers, as referenced above.

Therefore, the disclosure provides the ability to handle multiple, such as dual, wafer sizes without need to change over the end effector. This capability is, in part, provided by an actuated moving clamp. The moving clamp may be vacuum-powered, motorized, pneumatic, spring-actuated, or the like. Due to the exemplary use of low friction wafer clamping, such as via a low-friction piston drive and/or a low-friction slide associated with the moving clamp, precise speed and lower loads are made available through the use of certain of the embodiments, which minimize friction and thus prospective wafer damage while nevertheless improving wafer grip.

The foregoing apparatuses, systems and methods may also include the control of the various robotic functionality referenced throughout. Such control may include, by way of non-limiting example, manual control using one or more user interfaces, such as a controller, a keyboard, a mouse, a touch screen, or the like, to allow a user to input instructions for execution by software code associated with the robotics and with the systems discussed herein. Additionally, and as is well known to those skilled in the art, system control may also be fully automated, such as wherein manual user interaction only occurs to "set up" and program the referenced functionality, i.e., a user may only initially program or upload computing code to carry out the predetermined movements and operational sequences discussed throughout. In either a manual or automated embodiment, or in any combination thereof, the control may be programmed, for example, to relate the known positions of wafers, the bearing arm, the fork portion, and so on.

Figure 16:
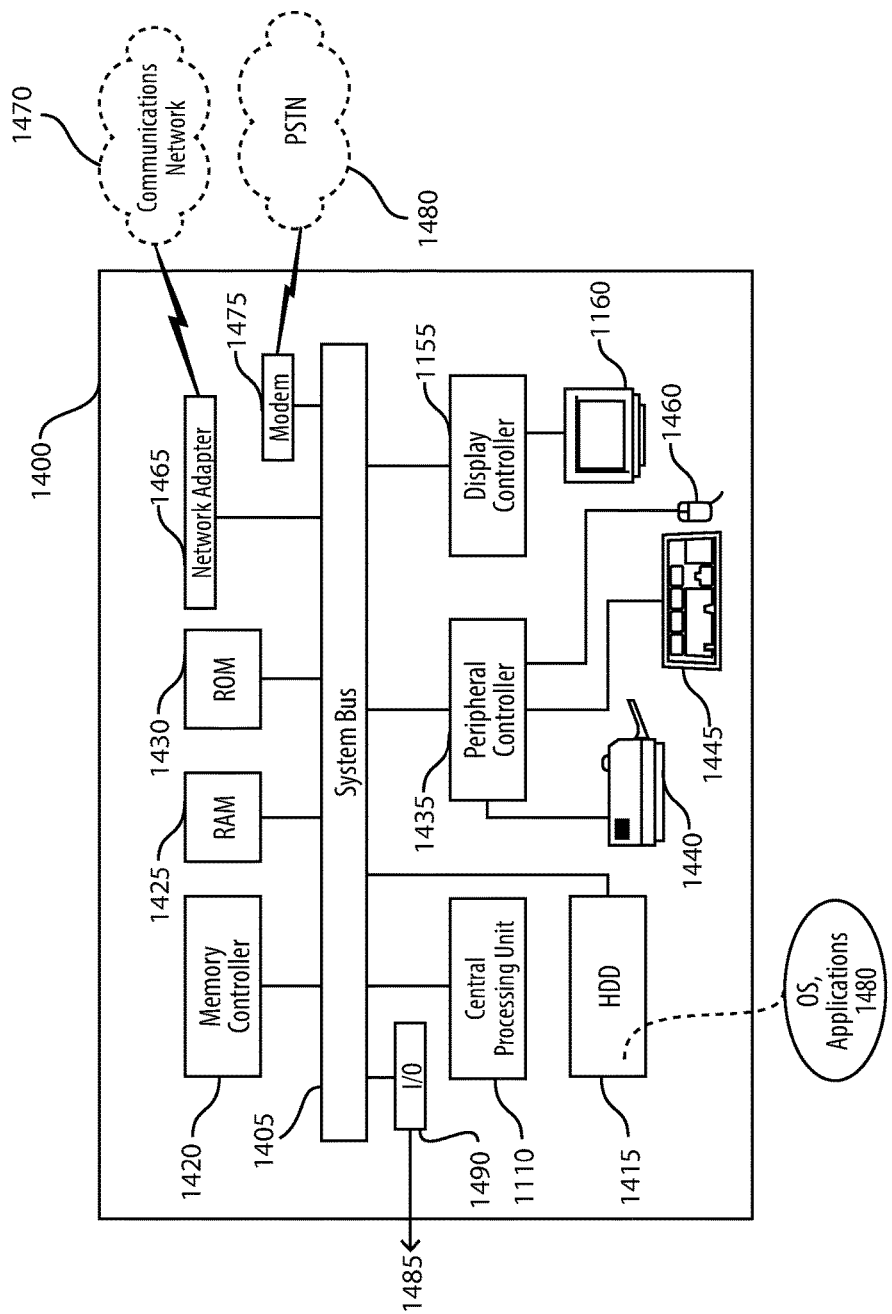
FIG. 16 is an illustration of a processing system according to the disclosed embodiments.

FIG. 16 illustrates an exemplary embodiment of a computer processing system 1400 that may be operably employed in embodiments discussed herein, including to program the robotic control, and that may accordingly perform the processing and logic discussed throughout. That is, the exemplary computing system 1400 is just one example of a system that may be used in accordance with herein described systems and methods.

Computing system 1400 is capable of executing software, such as an operating system (OS) and one or more computing applications 1490. The software may likewise be suitable for operating and/or monitoring hardware, such as via inputs/outputs (I/O), using said applications 1490.

The operation of exemplary computing system 1400 is controlled primarily by computer readable instructions, such as instructions stored in a computer readable storage medium, such as hard disk drive (HDD) 1415, optical disk (not shown) such as a CD or DVD, solid state drive (not shown) such as a USB "thumb drive," or the like. Such instructions may be executed within central processing unit (CPU) 1410 to cause computing system 1400 to perform the disclosed operations. In many known computer servers, workstations, PLCs, personal computers, mobile devices, and the like, CPU 1410 is implemented in an integrated circuit called a processor.

The various illustrative logics, logical blocks, modules, and engines, described in connection with the embodiments disclosed herein may be implemented or performed with any of a general purpose CPU, a digital signal processor (DSP), an application specific integrated circuit (ASIC), a field programmable gate array (FPGA) or other programmable logic device, discrete gate or transistor logic, discrete hardware components, or any combination thereof, respectively acting as CPU 1410. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

It is appreciated that, although exemplary computing system 1400 is shown to comprise a single CPU 1410, such description is merely illustrative, as computing system 1400 may comprise a plurality of CPUs 1410. Additionally, computing system 1400 may exploit the resources of remote or parallel CPUs (not shown), for example, through local or remote communications network 1470 or some other data communications means.

In operation, CPU 1410 fetches, decodes, and executes instructions from a computer readable storage medium, such as HDD 1415. Such instructions can be included in the software, such as the operating system (OS), executable programs/applications, and the like. Information, such as computer instructions and other computer readable data, is transferred between components of computing system 1400 via the system's main data-transfer path. The main data-transfer path may use a system bus architecture 1405, although other computer architectures (not shown) can be used, such as architectures using serializers and deserializers and crossbar switches to communicate data between devices over serial communication paths.

System bus 1405 may include data lines for sending data, address lines for sending addresses, and control lines for sending interrupts and for operating the system bus. Some busses provide bus arbitration that regulates access to the bus by extension cards, controllers, and CPU 1410. Devices that attach to the busses and arbitrate access to the bus are called bus masters. Bus master support also allows multi-processor configurations of the busses to be created by the addition of bus master adapters containing processors and support chips.

Memory devices coupled to system bus 1405 can include random access memory (RAM) 1425 and read only memory (ROM) 1430. Such memories include circuitry that allows information to be stored and retrieved. ROMs 1430 generally contain stored data that cannot be modified. Data stored in RAM 1425 can generally be read or changed by CPU 1410 or other communicative hardware devices. Access to RAM 1425 and/or ROM 1430 may be controlled by memory controller 1420. Memory controller 1420 may provide an address translation function that translates virtual addresses into physical addresses as instructions are executed. Memory controller 1420 may also provide a memory protection function that isolates processes within the system and that isolates system processes from user processes. Thus, a program running in user mode can normally access only memory mapped by its own process virtual address space; it cannot access memory within another process' virtual address space unless memory sharing between the processes has been set up.

The steps and/or actions described in connection with the aspects disclosed herein may be embodied directly in hardware, in a software module executed by a processor, or in a combination of the two, in communication with memory controller 1420 in order to gain the requisite performance instructions. That is, the described software modules to perform the functions and provide the directions discussed herein throughout may reside in RAM memory, flash memory, ROM memory, EPROM memory, EEPROM memory, registers, a hard disk, a removable disk, a CD-ROM, or any other form of storage medium known in the art. Any one or more of these exemplary storage medium may be coupled to the processor 1410, such that the processor can read information from, and write information to, that storage medium. In the alternative, the storage medium may be integral to the processor. Further, in some aspects, the processor and the storage medium may reside in an ASIC. Additionally, in some aspects, the steps and/or actions may reside as one or any combination or set of instructions on an external machine readable medium and/or computer readable medium as may be integrated through I/O port(s) 1485, such as a "flash" drive.

In addition, computing system 1400 may contain peripheral controller 1435 responsible for communicating instructions using a peripheral bus from CPU 1410 to peripherals and other hardware, such as printer 1440, keyboard 1445, and mouse 1460. An example of a peripheral bus is the Peripheral Component Interconnect (PCI) bus.

One or more hardware input/output (I/O) devices 1485 may be in communication with hardware controller 1490. This hardware communication and control may be implemented in a variety of ways and may include one or more computer busses and/or bridges and/or routers. The I/O devices controlled may include any type of port-based hardware (and may additionally comprise software, firmware, or the like), and can also include network adapters and/or mass storage devices from which the computer system 1400 can send and receive data for the purposes disclosed herein. The computer system 1400 may thus be in communication with the Internet or other networked devices/PLCs via the I/O devices 1485 and/or via communications network 1470.

Display 1450, which is controlled by display controller 1455, may optionally be used to display visual output generated by computing system 1400. Display controller 1455 may also control, or otherwise be communicative with, the display. Visual output may include text, graphics, animated graphics, and/or video, for example. Display 1450 may be implemented with a CRT-based video display, an LCD-based display, gas plasma-based display, touch-panel, or the like. Display controller 1455 includes electronic components required to generate a video signal that is sent for display.

Further, computing system 1400 may contain network adapter 1465 which may be used to couple computing system 1400 to an external communication network 1470, which may include or provide access to the Internet, and hence which may provide or include tracking of and access to the process data discussed herein. Communications network 1470 may provide access to computing system 1400 with means of communicating and transferring software and information electronically, and may be coupled directly to computing system 1400, or indirectly to computing system 1400, such as via PSTN or cellular network 1480. Additionally, communications network 1470 may provide for distributed processing, which involves several computers and the sharing of workloads or cooperative efforts in performing a task. It is appreciated that the network connections shown are exemplary and other means of establishing communications links between multiple computing systems 1400 may be used.

It is appreciated that exemplary computing system 1400 is merely illustrative of a computing environment in which the herein described systems and methods may operate, and thus does not limit the implementation of the herein described systems and methods in computing environments having differing components and configurations. That is, the concepts described herein may be implemented in various computing environments using various components and configurations.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. An end effector capable of accommodating semiconductor wafers of varying sizes, comprising:
    a wafer support;
    a bearing arm capable of interfacing with at least one robotic element, and at least partially bearing the wafer support at one end thereof;
    a plurality of support pads on the wafer support for physically interfacing with a one of the semiconductor wafers;
    a low friction moving clamp driven bi-directionally along a plane at least partially provided by the bearing arm, wherein the low friction moving clamp retractably applies force to a proximal edge of the semiconductor wafer for the physical interfacing of the semiconductor wafer with the plurality of support pads; and
    a low friction vacuum cylinder engaged for a moving clamp motor;
    wherein the vacuum cylinder consists of a seal-less glass tube with a graphite piston.

2. The end effector of claim 1, wherein the wafer support comprises a fork.

3. The end effector of claim 1, wherein the varying sizes comprise 200 mm and 300 mm.

4. The end effector of claim 1, wherein the bi-directional drive comprises at least the moving clamp motor.

5. The end effector of claim 4, further comprising at least one retract stop that stops retraction of the low friction moving clamp after actuation of the low friction moving clamp by the bi-directional drive.

6. The end effector of claim 4, further comprising at least one travel stop that stops travel of the low friction moving clamp upon actuation by the bi-directional drive.

7. The end effector of claim 1, wherein at least one retract stop for the low friction moving clamp comprises a button.

8. The end effector of claim 1, wherein the low friction moving clamp comprises a rectangular strike face to apply the force.

9. The end effector of claim 1, wherein the low friction moving clamp comprises an angular strike face to apply the force.

10. The end effector of claim 9, wherein the angular strike face pivots about a substantially center pivot point.

11. The end effector of claim 1, wherein the plurality of support pads comprises at least four support pads, and wherein at least two of the support pads are proximal to the bearing arm, and wherein at least two others of the support pads are distal to the bearing arm.

12. The end effector of claim 1, wherein the wafer support further comprises at least one vacuum eyelet for gripping the semiconductor wafer.

13. The end effector of claim 1, wherein the wafer support further comprises a fiber optic wafer presence sensor.

14. An end effector capable of accommodating semiconductor wafers of varying sizes, comprising:
    a wafer support;
    a bearing arm capable of interfacing with at least one robotic element, and at least partially bearing the wafer support at one end thereof;
    a plurality of support pads on the wafer support for physically interfacing with a one of the semiconductor wafers;
    a low friction moving clamp driven bi-directionally along a plane at least partially provided by the bearing arm, wherein the low friction moving clamp retractably applies force to a proximal edge of the semiconductor wafer for the physical interfacing of the semiconductor wafer with the plurality of support pads; and
    at least one retract stop that stops retraction of the low friction moving clamp after actuation of the low friction moving clamp by the bi-directional drive;
    wherein the bi-directional drive comprises at least a moving clamp motor, and wherein the at least one retract stop is vacuum operated.

15. An end effector capable of accommodating semiconductor wafers of varying sizes, comprising:
    a wafer support;
    a bearing arm capable of interfacing with at least one robotic element, and at least partially bearing the wafer support at one end thereof;
    a plurality of support pads on the wafer support for physically interfacing with a one of the semiconductor wafers; and
    a low friction moving clamp driven bi-directionally along a plane at least partially provided by the bearing arm, wherein the low friction moving clamp retractably applies force to a proximal edge of the semiconductor wafer for the physical interfacing of the semiconductor wafer with the plurality of support pads;
    wherein the low friction moving clamp comprises an angular strike face to apply the force, wherein the angular strike face pivots about a substantially center pivot point, and wherein the low friction moving clamp further comprises two canted rollers capable of substantially imparting the strike force.

16. An end effector capable of accommodating semiconductor wafers of varying sizes, comprising:
    a wafer support;
    a bearing arm capable of interfacing with at least one robotic element, and at least partially bearing the wafer support at one end thereof;
    a plurality of support pads on the wafer support for physically interfacing with a one of the semiconductor wafers;
    a low friction moving clamp driven bi-directionally along a plane at least partially provided by the bearing arm, wherein the low friction moving clamp retractably applies force to a proximal edge of the semiconductor wafer for the physical interfacing of the semiconductor wafer with the plurality of support pads;
    wherein the plurality of support pads comprises at least four support pads, and wherein at least two of the support pads are proximal to the bearing arm, and wherein at least two others of the support pads are distal to the bearing arm, and wherein the at least two distal support pads each comprise a ramped portion and a roller portion having a center axis canted in relation to a center axis of the semiconductor wafer.

17. The end effector of claim 16, wherein the at least two proximal support pads comprise a ramped portion.

18. The end effector of claim 16, wherein at least the proximal support pads or the distal support pads comprise a raised ridge portion.

* * * * *